US009748003B2

(12) United States Patent
Jung et al.

(10) Patent No.: US 9,748,003 B2
(45) Date of Patent: Aug. 29, 2017

(54) EFFICIENT CODING FOR MEMORY REDUNDANCY

(71) Applicant: QUALCOMM Incorporated, San Diego, CA (US)

(72) Inventors: Chulmin Jung, San Diego, CA (US); Sei Seung Yoon, San Diego, CA (US); Robert Henry Hoem, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 53 days.

(21) Appl. No.: 14/485,379

(22) Filed: Sep. 12, 2014

(65) Prior Publication Data

US 2016/0078969 A1     Mar. 17, 2016

(51) Int. Cl.
| | | |
|---|---|---|
| *G11C 8/12* | (2006.01) | |
| *G11C 29/00* | (2006.01) | |
| *G11C 11/418* | (2006.01) | |
| *G11C 17/16* | (2006.01) | |
| *G11C 17/18* | (2006.01) | |
| *G11C 8/10* | (2006.01) | |

(52) U.S. Cl.
CPC .............. *G11C 29/781* (2013.01); *G11C 8/10* (2013.01); *G11C 8/12* (2013.01); *G11C 11/418* (2013.01); *G11C 17/16* (2013.01); *G11C 17/18* (2013.01); *G11C 29/76* (2013.01); *G11C 29/802* (2013.01); *G11C 29/806* (2013.01)

(58) Field of Classification Search
CPC ...... G11C 29/781; G11C 11/418; G11C 17/16
See application file for complete search history.

(56) References Cited

U.S. PATENT DOCUMENTS

| | | | | |
|---|---|---|---|---|
| 5,257,229 | A * | 10/1993 | McClure | ............. G11C 29/846 |
| | | | | 326/106 |
| 5,422,850 | A | 6/1995 | Sukegawa et al. | |
| 6,694,448 | B2 | 2/2004 | Callahan | |
| 6,807,114 | B2 | 10/2004 | Keeth et al. | |
| 7,359,261 | B1 | 4/2008 | Wu et al. | |
| 2001/0022751 | A1* | 9/2001 | Nagai | .................. G11C 29/808 |
| | | | | 365/200 |
| 2005/0007843 | A1 | 1/2005 | Choi et al. | |
| 2006/0245279 | A1 | 11/2006 | Kang | |
| 2007/0014167 | A1 | 1/2007 | Lee | |
| 2011/0242917 | A1 | 10/2011 | Yoo et al. | |
| 2013/0265815 | A1 | 10/2013 | Kim et al. | |

OTHER PUBLICATIONS

International Search Report and Written Opinion—PCT/US2015/041250—ISA/EPO—dated Oct. 30, 2015.

* cited by examiner

*Primary Examiner* — Douglas King
(74) *Attorney, Agent, or Firm* — Haynes and Boone, LLP

(57) ABSTRACT

A system may be provided that provides redundancy for a plurality of embedded memories such as SRAMs. The system may include one or more decoders, each capable of decoding a selection address to identify a defective one of the embedded memories.

9 Claims, 8 Drawing Sheets

EFFICIENT CODING FOR MEMORY REDUNDANCY

TECHNICAL FIELD

This application relates to memories, and more particularly to a coding technique for column and row redundancy.

BACKGROUND

Modern integrated circuits such as a system on a chip (SOC) may include hundreds if not thousands of embedded memories such as static random access memories (SRAMs). The bit cells in the embedded SRAMs make up the smallest features in the SOC and so they are the most vulnerable to manufacturing errors. Because of the small size of the SRAM bitcells, manufacturing defects will affect the SRAM bit cells before affecting larger features such as logic gates. Depending upon the process node and the number of the SRAM bit cells, the SOC may be required by foundry rules to implement column redundancy and/or row redundancy. For example, 90% of the total SRAM bitcells on an SOC may need to be replaceable through redundancy schemes.

In the absence of any manufacturing defects, a memory with redundant columns and/or redundant rows operates without using these redundant features. But if a manufacturing defect causes an error, the function of the defective column or row is replaced by its redundant counterpart. To effect this replacement, a redundancy scheme requires some way to identify the defective feature (column or row). Moreover, an integrated circuit such as a system on a chip (SOC) may include assorted embedded memories. So the redundancy scheme for an SOC must not only identify the defective feature but also the particular memory having the defective feature. For example, suppose there are two thousand embedded SRAMs each having one hundred and twenty eight columns. Identifying a defective column from 128 possibilities for each of the two-thousand SRAMs requires two-thousand 7-bit words (14,000 bits total). It is conventional to use a fuse-based ROM to store the redundancy information. But if the redundancy information is tens of thousands of bits, storing this information in a fused-based ROM then demands substantial die space to instantiate so many fuses.

Accordingly, there is a need in the art for a more efficient enabling of redundancy in memory arrays.

SUMMARY

To meet the need in the art for reduced redundancy storage demands, an integrated circuit is provided having memory redundancy that includes at least one decoder. Each decoder decodes a corresponding selection address to select from the embedded memories a particular memory having a defect. For example, if M decoders are provided (M being a positive plural integer), then M defective embedded memories may be identified so as to implement the required redundancy (which may be column redundancy and/or row redundancy). The integrated circuit includes a programmable memory such as a read-only memory (ROM) for storing the M corresponding selection addresses that are decoded by the M decoders. Because of the encoding for the addresses decoded by each decoder, relatively few bits may be used to encode for a substantial number of embedded memories.

For example, suppose that an integrated circuit includes 9,000 embedded memories that may each be enabled to implement row or column redundancy. A sixteen-bit selection address may then enable redundancy in any of the embedded memories having a corresponding defect in that integrated circuit. Each decoder decodes a corresponding selection address to enable the appropriate embedded memory to repair its defects through redundancy such as by asserting a select signal to the defective embedded memory. As used herein, the select signal is also denoted as a redundancy enable signal. If the integrated circuit is to have the ability to enable redundancy in two embedded memories, then two selection addresses decoded by two corresponding decoders provides the ability to repair any two embedded memories on the die. More generally, M selection addresses and M corresponding decoders provides the ability to repair M embedded memories on the die, where M is a plural positive integer. Such an embodiment may be deemed to comprise an M-way redundancy decoder.

A ROM such as a fuse-based ROM may store the selection address(es) for the decoder(s). In general, it may be the case that no embedded memories have defects. In such a case, there would be no selection addresses to store in the ROM. Alternatively, there may be one defective memory identified by one selection address. Similarly, two selection addresses stored in the ROM may identify two defective embedded memories, and so on. In addition, note that each defective memory requires a redundancy address such as a column address to identify the defective column. The combination of the selection address and the corresponding redundancy address may be deemed to form a redundancy vector or word. In an embodiment having M decoders, there would thus be the possibility of M redundancy vectors stored in the ROM should there be M defective embedded memories.

Each redundancy vector corresponds to a decoder. For example, suppose that there are four decoders, ranging from a zeroth decoder to a third decoder. The ROM would then include storage space for four corresponding redundancy vectors, ranging from a zeroth redundancy vector to a third redundancy vector. Each decoder receives the selection address from the corresponding redundancy vector from the ROM. There is always the possibility that there is no defective embedded memory needing redundancy for a given decoder. To prevent the decoder from decoding a selection address should there be no defective embedded memory needing identification, each redundancy vector can include an enable signal such as an enable bit. The corresponding decoder would then only decode its selection address if the enable signal in the redundancy vector is asserted.

Each decoder may have the ability to enable redundancy in any of the embedded memories. For example, each embedded memory may receive an output of a corresponding logic gate such as an OR gate that receives the embedded memory's redundancy enable signal from the various decoders. Since the selection addresses are all unique, only one decoder from the plurality of decoders will assert a given defective embedded memory's redundancy enable signal. Thus, only the asserted redundancy enable signal from the appropriate decoder will pass through the logic gate to the corresponding embedded memory. In addition, each embedded memory may receive the redundancy address from each redundancy vector. To provide the ability to select for the appropriate redundancy address, each embedded memory associates with a corresponding multiplexer that receives the various redundancy addresses. The redundancy enable signals from the decoders for the corresponding embedded memory control the selection at the multiplexer.

The resulting redundancy decoding architecture is quite advantageous in that a relatively small number of bits control the redundancy implementation on a relatively large number of embedded memories. These advantageous features may be better appreciated through the following detailed description. Reference will be made to the appended sheets of drawings that will first be described briefly.

DETAILED DESCRIPTION

Improved redundancy schemes are provided for systems having a plurality of embedded memories. The following examples are directed to the implementation of redundancy in embedded SRAMs but it will be appreciated that the techniques and circuits disclosed herein are applicable to the implementation of redundancy in other types of memories such as embedded DRAMS.

Modern integrated circuits such as an SOC may include many thousands of embedded memories. The improved column redundancy schemes disclosed herein provide the ability to repair defects in such SOCs without requiring an impractically high number of fuses or other means to store the redundancy data that identifies the defective memory (or memories) and the corresponding redundancy addresses to identify the faulty row(s) or column(s).

Figure 1:
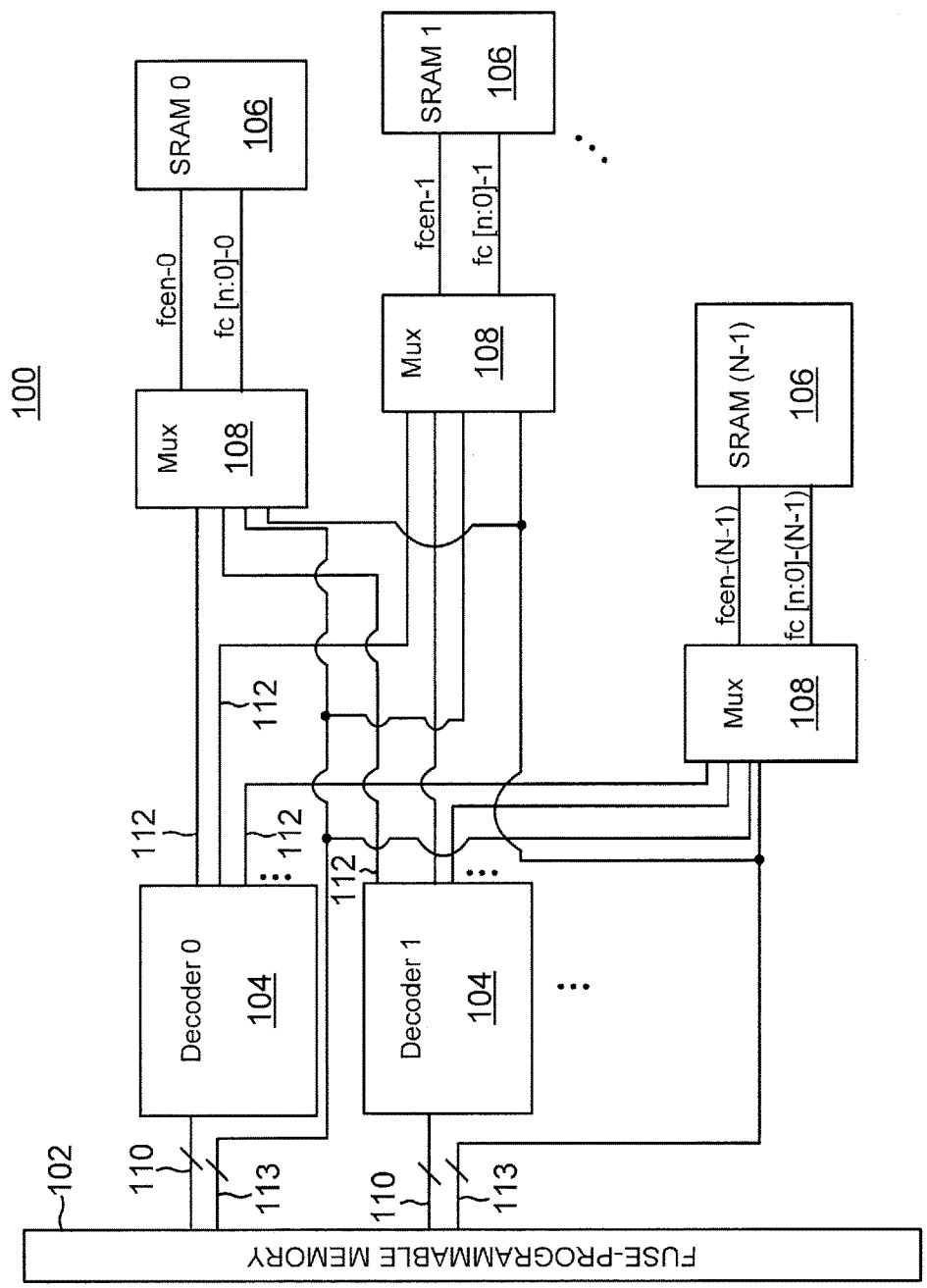
FIG. 1 is a block diagram of a system having an improved redundancy scheme in accordance with an embodiment of the disclosure.

In particular, a system is provided in which a programmable memory such as a fuse-programmable memory is used to store not only the redundancy address of a defective column or row in a memory but also the selection address identifying the embedded memory containing the defective column or row. Turning now to the figures, FIG. 1 is a block diagram showing a system such as a system-on-a-chip (SOC) 100 including multiple embedded memories such as SRAMs 106. SOC 100 may include any suitable number of SRAMs 106 (e.g., more than 1,000 SRAMs, or more than 10,000 SRAMs). In general, SOC 100 will include N SRAMs 106 ranging from a zeroth SRAM 106 to an (N−1)th SRAM 106, where N is a plural positive integer. SRAMs 106 may each include one or more redundant rows and/or columns that, when redundancy is enabled, can be used to replace one or more defective rows and/or columns. During manufacture, SRAMs 106 of SOC 100 may be tested to determine which, if any, of SRAMs 106 have defective rows and/or columns. A plurality of redundancy vectors that identify defective SRAMs 106 through corresponding selection addresses may be stored in a programmable read-only memory (ROM) such as a fuse-programmable ROM 102. A corresponding plurality of decoders 104 are configured to decode the selection addresses. For example, suppose there are 256 (or fewer) SRAMs 106. An eight-bit selection address may then identify any of the SRAMs 106 in such an embodiment. Similarly, if SOC 100 includes 10,000 SRAMs 106, a 14-bit selection address may then identify a particular defective SRAM 106.

Each selection address may be decoded by a corresponding decoder 104. The number of decoders 104 thus determines the number of defective SRAMs 106 that may be repaired using redundancy. ROM 102 may store a corresponding redundancy vector for each decoder 104. From the corresponding redundancy vector, each decoder 104 receives the vector's selection address on a bus 110. The width of each bus 110 depends upon the number of SRAMs 106 as discussed earlier with regard to the number of bits in each selection address. Each decoder 104 may assert an appropriate select signal (also denoted as a redundancy enable signal) 112 upon decoding the corresponding selection address for a defective SRAM 106. The number of select signals 112 depends upon the number N of SRAMs 106. For example, each decoder 104 may assert a zeroth select signal 112 to select for the zeroth SRAM 106. If there are four decoders 104, there would be four corresponding select signals 112 for the zeroth SRAM 106. Similarly, each decoder may assert a first select signal 112 to select for the first SRAM 106, and so on.

Although each decoder 104 is configured to decode the selection address portion of the corresponding redundancy vector, decoders 104 need not decode the redundancy address portions of the redundancy vectors. Instead, it is the redundancy circuitry (not illustrated) within each SRAM 106 that decodes the corresponding redundancy address should an SRAM 106 be identified as defective through its selection address. Such decoding of a redundancy address within an SRAM is conventional in the row and column redundancy arts. But what is not conventional is the advantageous use of decoders 104 to identify the defective SRAMs 106 through decoding of the corresponding selection addresses.

Since each defective SRAM 106 requires its own redundancy address to identify the defective column or row, the redundancy addresses are carried on buses 113 to multiplexers 108 for each SRAM 106. Each SRAM 106 associates with its own corresponding multiplexer 108 that selects from the redundancy addresses carried on busses 113 for the various redundancy vectors responsive to the selection signals 112. The number of redundancy addresses that each multiplexer 108 receives depends on the number M of decoders 104 (and hence to the same number M of redundancy vectors stored in ROM 102). Selection signals 112 may act as the address or control signals for multiplexers 108. For example, suppose a zeroth decoder 104 has asserted the selection signal 112 for the zeroth SRAM 106. The multiplexer 108 for the zeroth SRAM 106 responds to this assertion by selecting for the redundancy address for a corresponding zeroth redundancy vector having a selection address decoded by the zeroth decoder 104. The selected redundancy address is denoted as fc[n:0]-0. Similarly, the selected redundancy address for the first SRAM 106 is denoted as fc[n:0]1, and so on such that the selected redundancy address for the final (N−1)th SRAM 106 is denoted as fc[n:b 0]N−1). The asserted selection signal from the multiplexer 108 for the zeroth SRAM 106 is denoted as a redundancy enable signal fcen-0. Similarly, the first SRAM 106 receives its asserted selection signal as a redundancy enable signal fcen-1, and so on such that the final (N−1)th SRAM 106 is denoted as fcen-(N−1).

Each multiplexer 108 also comprises a logic gate (not illustrated) such as an OR gate for receiving the various selection signals. For example, if there are four decoders 106, an OR gate in the multiplexer 108 for the zeroth SRAM 106 would receive four corresponding selection signals. Because the selection addresses are unique, only one selection signal at any given multiplexer 108 may be asserted. Such an asserted signal would pass through the OR gate as a corresponding asserted redundancy enable signal fcen.

The redundancy vector for each decoder 104 may also include an enable signal such as an enable bit for enabling decoding by the corresponding decoder 104. If a decoder 104 receives an enable bit that is not asserted, that decoder will not decode as there would be no selection address to decode in such a case. If, however, a decoder 104 is to select for a defective SRAM 106, the redundancy vector for that decoder 104 includes an asserted enable bit.

In one embodiment, a system may include a plurality of embedded memories such as SRAMs 106 each having redundancy and a first one of decoders 104 may be deemed to comprise a means for decoding a first selection address into a first redundancy enable signal for a first selected one of the embedded memories. In one embodiment, fuse-programmable memory 102 may be deemed to comprise a means for storing the first selection address and a first redundancy address that identifies a defective feature in the first selected embedded memory.

In the example of FIG. 1, each decoder 104 is coupled to every SRAM 106 via a corresponding multiplexer (Mux) 108 so that any decoder may be used to enable redundancy in any SRAM 106. However, this is merely illustrative. If desired, each decoder or corresponding group of decoders may be coupled to a subset of SRAMs 106 as shown for an SOC 200 in FIG. 2. A first set of SRAMs 203 receive their enable signals fcen and redundancy addresses fc[n:0] from a first set of decoders (which may comprise just one decoder if only one SRAM 106 in set 203 is to be repairable). The first set of decoders and the multiplexers for the SRAMs 106 in set 203 are represented by a decode/mux module 201. The redundancy vectors processed by decode/mux module 201 are received from ROM 102 on a bus 202. Another set of SRAMs 106 in a set 204 receive their enable signals fcen and redundancy addresses fc[n:0] from a decode/mux module 210 that receives its redundancy vectors from ROM 102 over a bus 215.

SOC 200 also includes a conventional non-decoded SRAM 206 that receives its enable signal fcen and redundancy vector fc[n:0] directly from ROM 102. In such a conventional storage, ROM 102 must reserve space for a redundancy vector for all the corresponding embedded memories having redundancy features. For example, if there are 500 embedded ROMs, then there must be storage space for the 500 redundancy addresses along with 500 redundancy enable signals. In sharp contrast, ROM 102 need only store one redundancy vector for each decoder 104. For example, if there are four decoders 104, ROM 102 would then store four redundancy vectors. The use of decoders 104 thus offers a dramatic storage space savings in ROM 102 should all SRAMs 106 instead be implemented as non-decoded embedded memories.

Referring again to FIG. 1, each multiplexer 108 provides a redundancy enable signal (e.g., a column redundancy enable signal, fcen) and a redundancy address for a defective row or column address (e.g., a defective column address fc[n:0], where the value n is sufficient to identify the defective column) to its corresponding SRAM 106 so that, for example, the column corresponding to address fc[n:0] is replaced using a redundant column in that SRAM. In one embodiment, n may be equal to 6 so that fc[n:0] is a seven bit word capable of identifying any of 128 columns.

In SOC 100, all of the redundancy addresses from all of the redundancy vectors stored in fuse-programmable memory 102, along with a select signal from each decoder 104 are provided to each multiplexer 108. In particular, each multiplexer 108 provides only one redundancy enable signal and one redundancy address to its corresponding SRAM 106. However, this is merely illustrative. In some embodiments, an SRAM may have, for example, a right and left half that are addressed separately through a corresponding right and left enable signal and corresponding left and right redundancy addresses such as column addresses as will be discussed further hereinafter.

Figure 2:
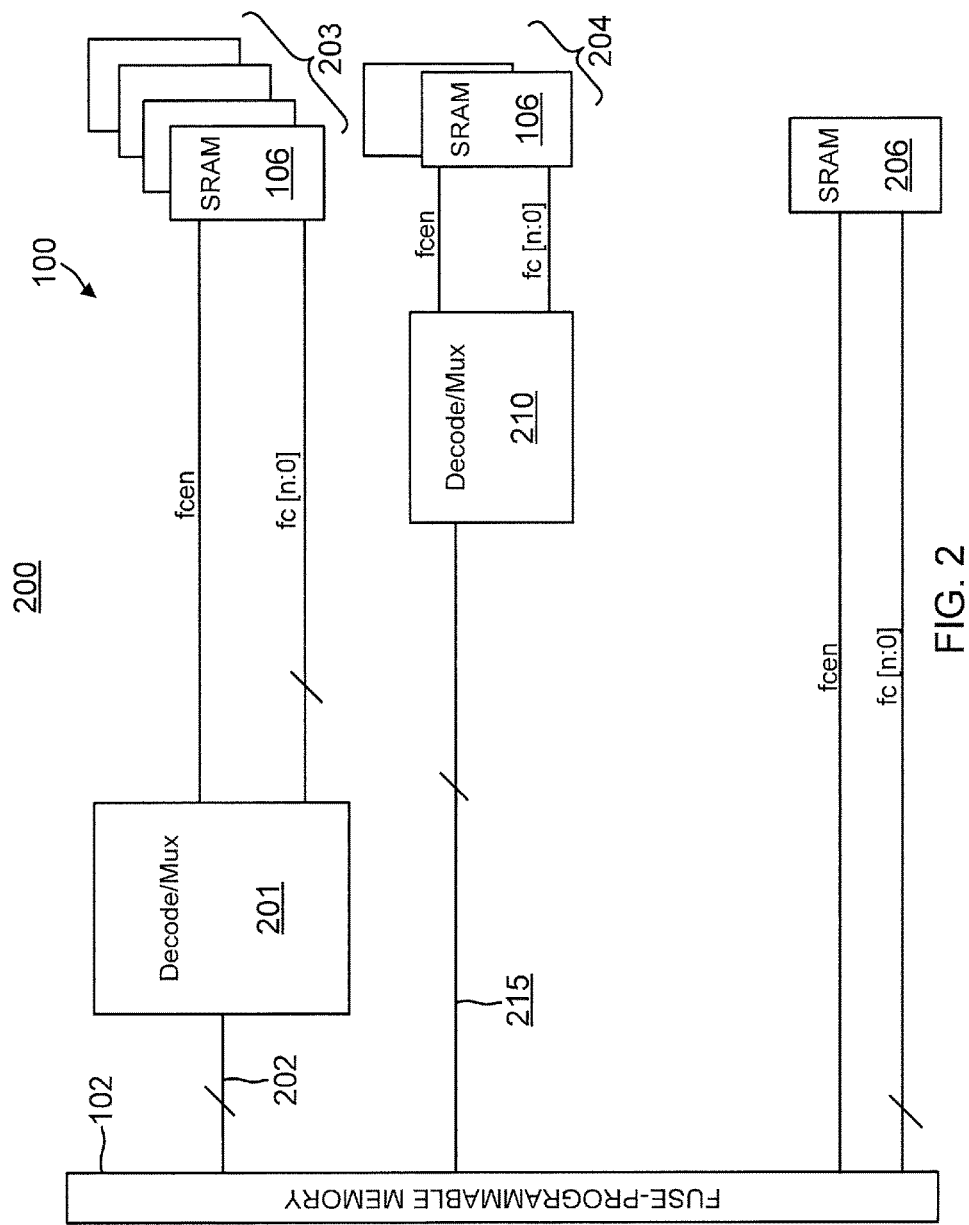
FIG. 2 is a block diagram of another implementation of a system having an improved redundancy scheme in accordance with an embodiment of the disclosure.
Figure 3:
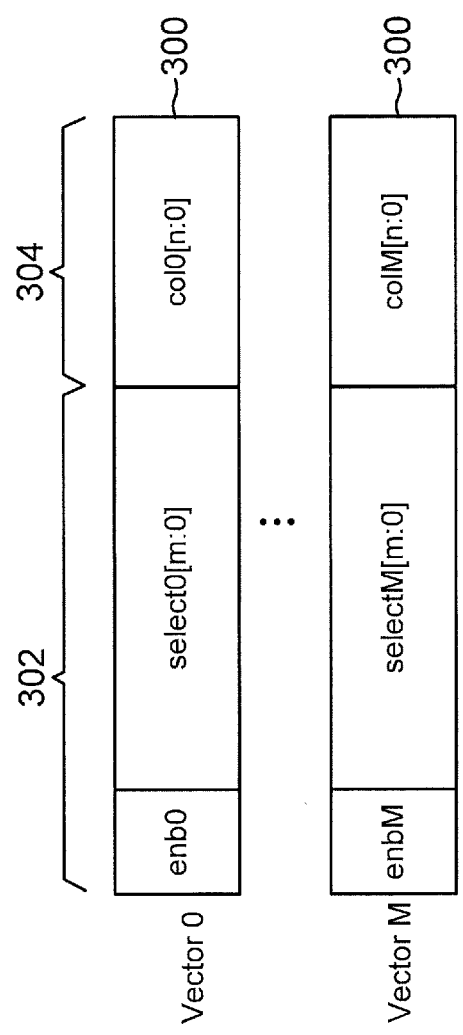
FIG. 3 is a block diagram of redundancy vectors in accordance with an embodiment of the disclosure.

FIG. 3 illustrates an exemplary set of vectors 300 that may be stored by ROM 102 of, for example, FIG. 1 or 2. As shown in FIG. 3, a system having M decoders may store up to M redundancy vectors (e.g., Vector 0 . . . Vector M). Each redundancy vector 300 may include an enable bit (e.g., an enable bit enb0 for the zeroth redundancy vector and an enable bit enbM for the Mth redundancy vector. The enable bit in a redundancy vector may be asserted such as by being set high to activate the decoding of the redundancy vector's selection address by the corresponding decoder.

Each redundancy vector 300 may include a selection address (e.g., an address select0[m:0] for the zeroth vector and an address selectM[m:0] for the Mth vector) to identify a defective embedded memory. Each redundancy vector 300 may also include a redundancy address of a defective feature such as a column or row address (e.g., a column address col0[n:0] for the zeroth vector and a column address colM [n:0] for the Mth vector) in the defective embedded memory addressed by the redundancy vector. The value m determines the width of the selection addresses and may thus be chosen so that select[m:0] includes a sufficient number of bits to identify any of the SRAMs. For example, m=7 allows for 8-bit selection addresses that may identify up to 256 SRAMs or SRAM portions. Similarly, m=14 allows for 15-bit selection addresses that may identify more than 32,000 SRAMs or SRAM portions. The integer M indicates the number of redundancy vectors and decoders.

A first portion 302 of each vector 300 may be provided to a corresponding decoder 104 and a second portion 304 of each vector 300 may be provided directly to multiplexers 108. As shown, the first portion may include the enable bit and the selection address whereas the second portion may include the redundancy address (e.g., a row or column address).

Figure 4:
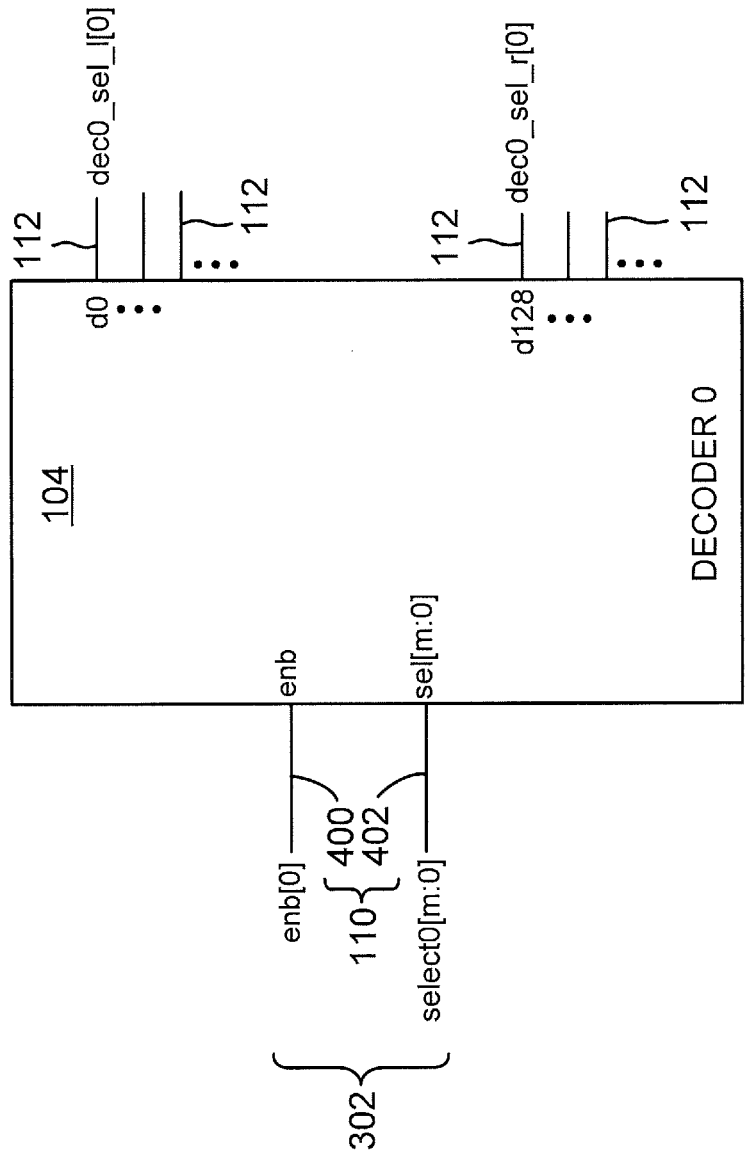
FIG. 4 is a block diagram of a decoder that may be used to selectively enable redundancy in accordance with an embodiment of the disclosure.

FIG. 4 is a diagram of an embodiment for a decoder 104 (e.g., the zeroth decoder, DECODER 0) showing how first portion 302 of zeroth redundancy vector 300 of FIG. 3 may be provided along conductive paths 110 (e.g., lines 400 and 402) to the zeroth decoder. Responsive to the enable bit and the selection address received, the decoder asserts an appropriate select signal 112 that functions as a redundancy enable signal. In this embodiment, each of the embedded memories that may be selected by zeroth decoder 104 has both a right side array and a left side array. In this embodiment, the number of possible addresses represented by the selection address will be twice the number of SRAMs since there are two halves to each SRAM. For example, zeroth decoder 104 may assert a left side array redundancy enable signal dec0_sel_1[0] for the left side of a zeroth SRAM (not illustrated) responsive to receiving a selection address corresponding to the left side of the zeroth SRAM. The right side array for the same SRAM has its redundancy enabled by a right redundancy enable signal dec0_sel_r[0] asserted by zeroth decoder 104 responsive to receiving a selection address corresponding to the right side of the zeroth SRAM.

In the example of FIG. 4, outputs d0-d127 of zeroth decoder 104 are configured to provide left half redundancy enable signals for any of 128 SRAMs and outputs d128-d255 of zeroth decoder 104 are configured to provide right half redundancy enable signals for any of those 128 SRAMs. However, this is merely illustrative. If desired, decoders 104 may be provided with more than 256 output lines, fewer than 256 output lines, or may provide only a single column or row redundancy enable signal to each SRAM.

Figure 5:
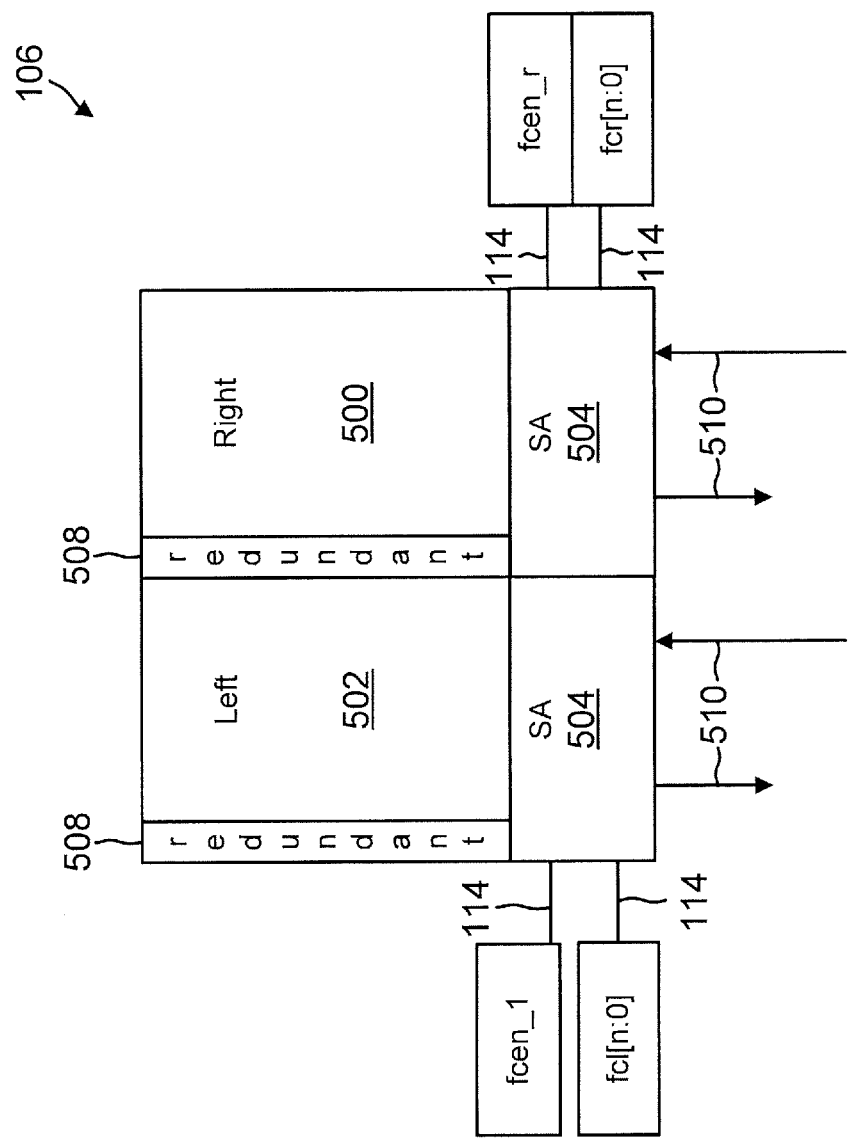
FIG. 5 is a block diagram of an SRAM configured to receive a redundancy enable signal and a corresponding defective column address in accordance with an embodiment of the disclosure.

FIG. 5 is a diagram of an SRAM 106 having a right half array 500 and a left half array 502, each having a corresponding sense amplifier (or amplifiers) 504 and corresponding redundant columns 508 that can be used to replace defective columns of right half 500 or left half 502. As shown in FIG. 5, read and write control signals 510 may be provided to SRAM 106 as well as redundancy enable signals and redundancy addresses (e.g., a right column redundancy enable signal fcen_r, a right defective column address fcr[n:0], a left column redundancy enable signal fcen_1, and a left defective column address fcl[n:0]). Responsive to the received signals, SRAM 106 may store data allocated to one or more defective columns in one or more of redundant columns 508 using, for example, additional multiplexing circuitry in the SRAM. In various embodiments, fcl[n:0] and/or fcr[n:0] may identify one or a group of defective columns to be replaced.

Figure 6:
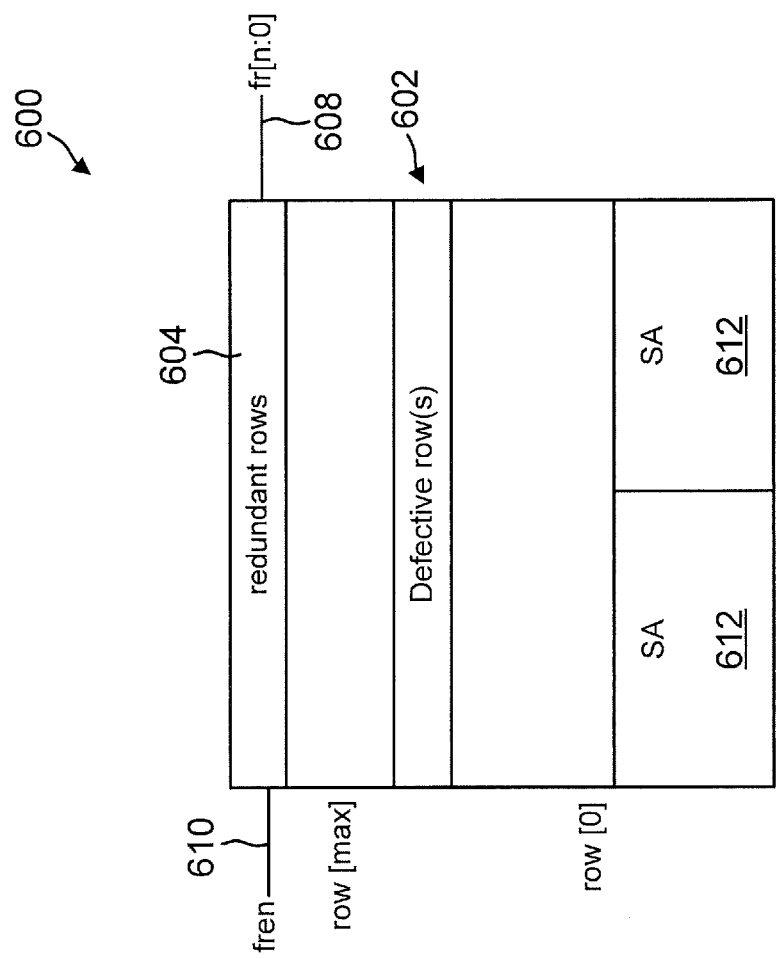
FIG. 6 is a block diagram of an SRAM to receive a redundancy enable signal and a corresponding defective row address in accordance in accordance with an embodiment of the disclosure.

FIG. 6 is a diagram of an SRAM 600 with redundant rows. As shown in FIG. 6, SRAM 600 may include one or more defective rows 602, one or more redundant rows 604 and one or more sense amplifiers 612. A row redundancy enable signal fren 610 and one or more defective row addresses fr[n:0] 608 may be provided to SRAM 600 to enable SRAM 600 to replace defective rows 602 with redundant rows 604. Row redundancy enable signal fren 610 may be generated by a decoder (not illustrated) in response to receiving an enable bit and a selection address of SRAM 600 as described with regard to FIGS. 1 and 2. The decoder may provide enable signal fren 610 to SRAM 600. Row address fr[n:0] 608 may be provided to SRAM 600 from a fuse-programmable memory such as fuse-programmable memory 102 of FIG. 1 (e.g., directly or via a multiplexer such as a multiplexer 108 associated with SRAM 600).

In various embodiments, one or more embedded memories may be coupled to one or more decoders for enabling redundancy based on stored memory addresses. For example, in one embodiment, each SRAM may be coupled to one particular decoder and arranged to have its redundancy enabled when that decoder receives an enable bit and the address of that SRAM. In this arrangement, the redundancy enable signal may be provided directly to the SRAM. In another embodiment such as the embodiment of FIG. 1, more than one decoder may be coupled to each SRAM via a multiplexer so that more than one or any decoder can enable redundancy in that SRAM.

Figure 7:
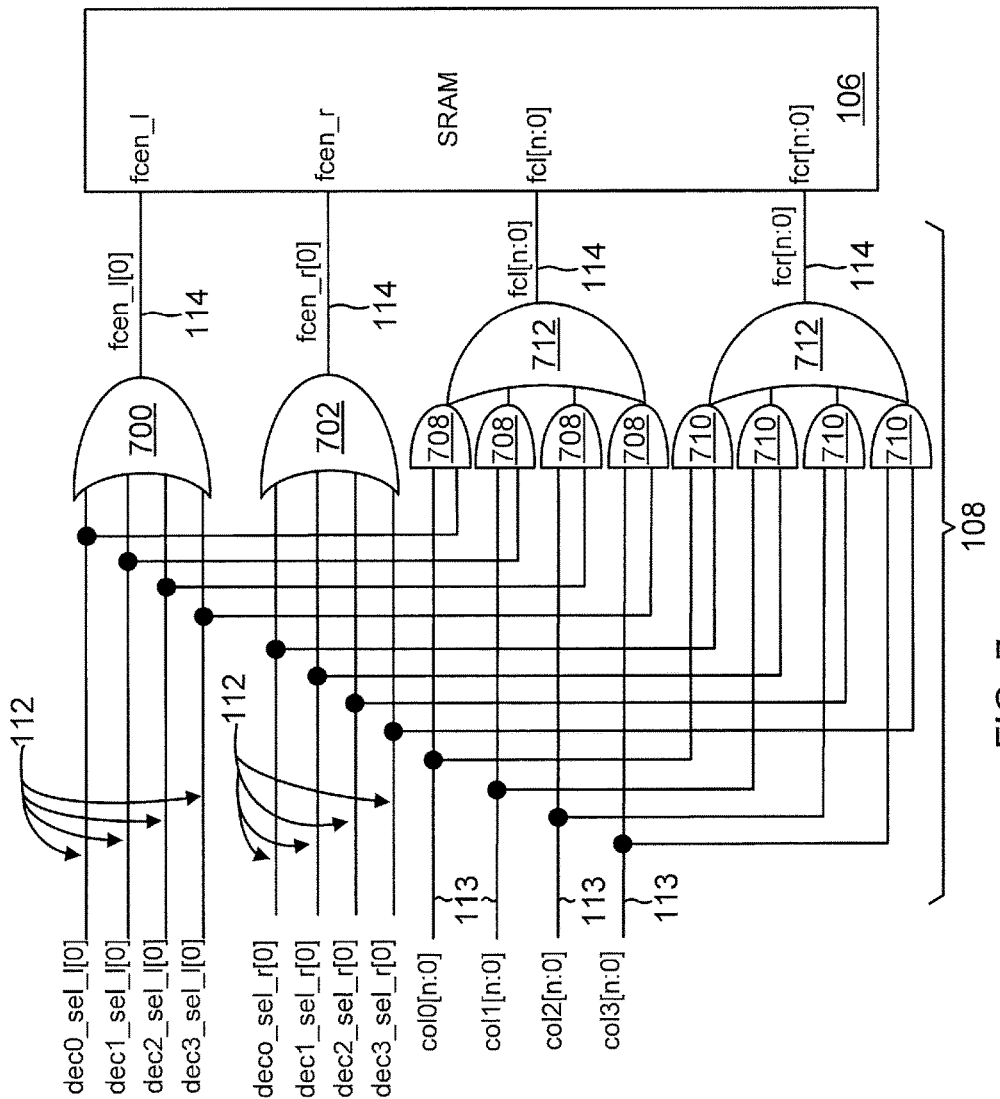
FIG. 7 is a block diagram of a multiplexer for selecting from redundancy addresses in accordance with an embodiment of the disclosure.

An example multiplexer 108 is shown in FIG. 7 for a system in which four decoders are provided that can each enable redundancy in a particular SRAM selected from an array of SRAMs. In the example of FIG. 7, multiplexer 108 corresponds to a zeroth SRAM 106. The remaining SRAMs (not illustrated) would each have a corresponding multiplexer as well. Multiplexer 108 receives right and left select signals from each of four decoders (not illustrated) labeled 0, 1, 2, and 3. The right select signals identify the right arrays in defective SRAMs and are represented by the variable dec_sel_r. A zeroth decoder may produce a dec0_sel_r select signal for the various SRAMs. For example, a dec0_sel_r[0] select signal selects for the right array in the zeroth SRAM 106. In this embodiment, there are four decoders so there are four dec_sel_r signals that may select for the right half array of the zeroth SRAM 106. Similarly, the four decoders produce corresponding left hand array selection signals represented by the variables dec_sel_1. For example, a first decoder (not illustrated) may assert a dec1_sel_1[0] signal to select for the left half array of the zeroth SRAM 106. Similarly, a second decoder (not illustrated) may provide signals dec2_sel_1[0] and dec2_sel_r[0], and a third decoder may provide signals dec3_sel_1[0] and dec3_sel_r[0], any of which can be set high or low by the associated decoder. Separately, multiplexer 108 receives a redundancy address such as a column address (e.g., col0[n:0], col1[n:0], col2[n:0], col3[n:0]) associated with each decoder from ROM 102 (FIGS. 1 and 2). The association between each column address and the associated decoder may be defined by the storage, in a common redundancy vector, of the column address and the enable bit and SRAM address provided to the associated decoder.

As shown, the left select signals from all four decoders may be provided to an OR gate 700 so that the left column redundancy enable signal fcen_1[0] for the zeroth SRAM 106 is only set high when one of left redundancy signals from one of the decoders is set high. The right redundancy signals from all four decoders may be provided to an OR gate 702 so that the right column redundancy enable signal fcen_r[0] for the zeroth SRAM is only set high when one of right redundancy signals from one of the decoders is set high.

Each left half select signal may be received by a corresponding AND gate 708. Similarly, each right half select signal may be received by a corresponding AND gate 710. Each AND gate 708 and 710 also receives a corresponding redundancy address such as the column address. Since either of the right and left select signals can be asserted at any given time for a particular SRAM such as the zeroth SRAM 106, only the redundancy address from the redundancy vector having the active selection address will pass through the appropriate set of AND gates 708 and 710. An OR gate 712 receives the outputs from AND gates 708. Similarly, another OR gate 712 receives the outputs from AND gates 710. The corresponding redundancy address will then pass through one of the OR gates 712 in multiplexer 108 of FIG. 7 as a left hand column address fcl[n:0] or a right hand column address fcr[n:0].

For example, suppose that the left half select signal dec2_sel_1[0] from the second decoder is set high. The corresponding defective column address col2[n:0] will be passed through AND gates 708 and OR gate 712 to form left defective column address fcl[n:0]. The column(s) corresponding to address fcl[n:0] will then be replaced with one or more redundant columns. A method of operation will now be discussed.

Figure 8:
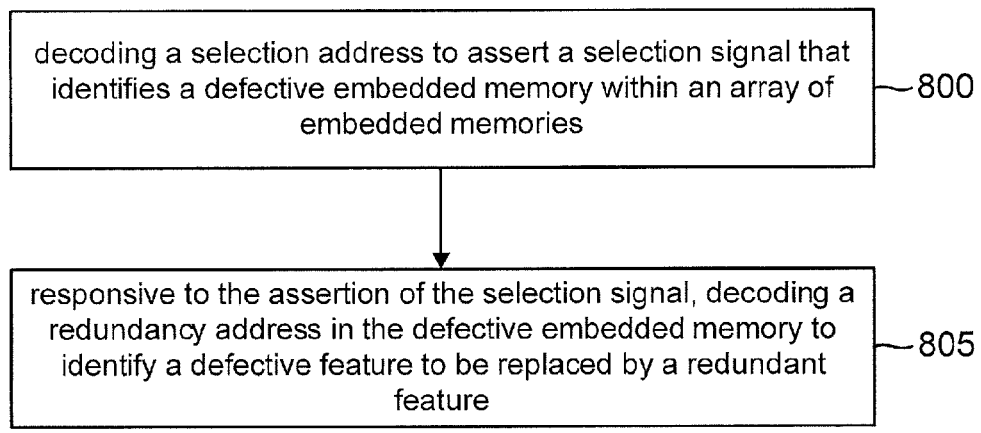
FIG. 8 is a flowchart for an example decoding method in accordance with an embodiment of the disclosure.

A flowchart for an example method of decoding such as within system 100 is shown in FIG. 8. An act 800 comprises decoding a selection address to assert a selection signal that identifies a defective embedded memory within an array of embedded memories. Any of decoders 104 in FIG. 1 may perform such an act if the decoder is enabled such as by the assertion of the enable bit in the corresponding redundancy vector stored in ROM 102. An act 805 is responsive to the assertion of the select signal and comprises decoding a redundancy address in the defective embedded memory to identify a defective feature to be replaced by a redundant feature. For example, suppose that an ith embedded memory is identified by the select signal from a second one of the decoders. This ith embedded memory would then decode the redundancy address to replace the corresponding defective feature with a redundancy replacement feature.

Figure 9:
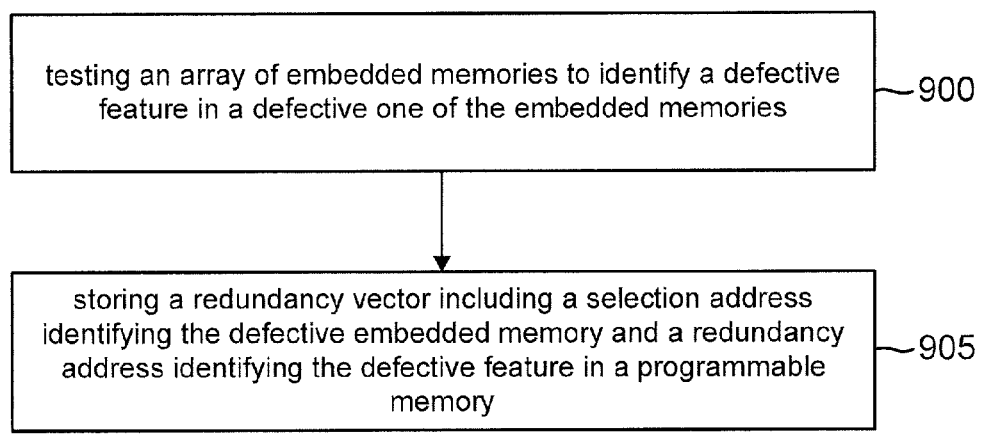
FIG. 9 is a flowchart for an example method of storing redundancy vectors in accordance with an embodiment of the disclosure.

There is also a method of programming the redundancy vector(s) as illustrated in the flowchart of FIG. 9. The method includes an act 900 of testing an array of embedded memories to identify a defective feature in a defective one of the embedded memories. Such testing is conventional upon manufacture of an integrated circuit such as an SOC including a plurality of embedded memories. But what is not conventional is an act 905 of storing a redundancy vector including a selection address identifying the defective embedded memory and a redundancy address identifying the defective feature in a programmable memory. The selection address is decoded as discussed earlier and results in a dramatic storage savings in the programmable memory as compared to the direct storage discussed above with regard to non-decoded embedded memory 206 of FIG. 2.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A system, comprising:
    a plurality of embedded memories, wherein each embedded memory includes a redundant feature selected from the group consisting of a redundant column and a redundant row, and wherein each embedded memory is configured to decode a memory redundancy address to select for the embedded memory's redundant feature while a redundancy enable signal for the embedded memory is asserted;
    a first decoder configured to decode a first selection address into a first selection signal to select for one of the embedded memories;
    a second decoder configured to decode a second selection address into a second selection signal to select for another one of the embedded memories;
    a fuse-programmable memory configured to store the first selection address, a first redundancy address, the second selection address, and a second redundancy address; and
    a plurality of multiplexers corresponding to the plurality of embedded memories, wherein each multiplexer is configured to both select for the first redundancy address as the memory redundancy address for its corresponding memory and to assert the redundancy enable signal for its corresponding memory when the first selection signal selects for the corresponding memory, and wherein each multiplexer is configured to both select for the second redundancy address as the memory redundancy address for its corresponding memory and to assert the redundancy address its corresponding memory when the second selection signal selects for to provide the second redundancy address as the memory redundancy address to its corresponding memory when the second selection signal selects for the corresponding memory.

2. The system of claim 1, wherein the first redundancy address is a column address or a row address.

3. The system of claim 1, wherein the plurality of embedded memories comprise static random access memories.

4. The system of claim 1, wherein the system further comprises additional decoders, and wherein each decoder is configured to provide a selection signal to any of the multiplexers based on stored selection addresses in the fuse-programmable memory.

5. The system of claim 1, further comprising a non-decoded embedded memory that is configured to receive a redundancy enable signal directly from the fuse-programmable memory.

6. A method, comprising:
    retrieving a first selection address and a first redundancy address from a fuse-programmable memory;
    in a first decoder, decoding the first selection address to assert a first selection signal that identifies, for an array of embedded memories, a first defective embedded memory from any one of the embedded memories in the array of embedded memories;
    within the first defective embedded memory, decoding the first redundancy address to identify a defective feature to be replaced by a redundant feature in the first defective embedded memory responsive to the assertion of the first selection signal;
    retrieving a second selection address and a second redundancy address from the fuse-programmable memory;
    in a second decoder, decoding the second selection address to assert a second selection signal that identifies a second defective embedded memory from any one of the embedded memories in the array of embedded memories; and
    within the second defective embedded memory, decoding the second redundancy address to identify a defective feature to be replaced by a redundant feature in the second defective embedded memory responsive to the assertion of the second selection signal.

7. The method of claim 6, further comprising:
    storing, in the fuse-programmable memory, a first redundancy vector including a first enable bit, the first selection address, and the first redundancy address; wherein decoding the first selection address is responsive to an assertion of the first enable bit.

8. The method of claim 6, wherein the first redundancy address is a column address identifying a defective column in the first defective embedded memory, the method further comprising replacing the defective column with a redundant column.

9. The method of claim 6, wherein the method comprises decoding additional redundancy vectors.

* * * * *